(12) United States Patent
Rantala et al.

(10) Patent No.: US 9,564,339 B2
(45) Date of Patent: Feb. 7, 2017

(54) ETCH RESISTANT ALUMINA BASED COATINGS

(75) Inventors: Juha T. Rantala, Espoo (FI); Thomas Gädda, Espoo (FI); Wei-Min Li, Espoo (FI); David A. Thomas, Espoo (FI); William McLaughlin, Espoo (FI)

(73) Assignee: Pibond Oy, Espoo (FI)

( * ) Notice: Subject to any disclaimer, the term of this patent is extended or adjusted under 35 U.S.C. 154(b) by 0 days.

(21) Appl. No.: 13/638,075

(22) PCT Filed: Mar. 29, 2010

(86) PCT No.: PCT/FI2010/050246
§ 371 (c)(1),
(2), (4) Date: Jan. 24, 2013

(87) PCT Pub. No.: WO2011/121166
PCT Pub. Date: Oct. 6, 2011

(65) Prior Publication Data
US 2013/0143408 A1  Jun. 6, 2013

(51) Int. Cl.
*H01L 21/311* (2006.01)
*H01L 21/308* (2006.01)
*C23C 18/12* (2006.01)

(52) U.S. Cl.
CPC ......... *H01L 21/308* (2013.01); *C23C 18/1216* (2013.01)

(58) Field of Classification Search
CPC ......... C08G 77/12; C08K 3/22; C09D 183/04; C09D 183/14; C23C 18/1245; C23C 18/14; C23C 18/1216; H01L 21/308; H01L 21/02145; H01L 21/02216; H01L 21/02282; H01L 21/02337; H01L 21/3122

USPC ...... 216/41, 51, 58, 63, 68, 74, 79; 438/689, 438/694, 700, 702, 706, 707, 710, 712, 717, 438/719, 725, 726, 736; 528/12, 25, 26, 31, 33, 528/35
See application file for complete search history.

(56) References Cited

U.S. PATENT DOCUMENTS

| | | | |
|---|---|---|---|
| 8,026,038 B2 * | 9/2011 | Ogihara et al. | 430/270.1 |
| 8,475,996 B2 * | 7/2013 | Aoai et al. | 430/270.1 |
| 2006/0128893 A1 * | 6/2006 | Hasegawa et al. | 525/100 |
| 2008/0206578 A1 | 8/2008 | Rantala et al. | |
| 2008/0292800 A1 | 11/2008 | Murayama et al. | |
| 2012/0103231 A1 * | 5/2012 | Ishihara et al. | 106/287.11 |

FOREIGN PATENT DOCUMENTS

| | | |
|---|---|---|
| JP | 2008-221201 A | 9/2008 |
| JP | 2009-126940 A | 6/2009 |
| KR | 2009-0114435 A | 11/2009 |
| WO | 2008/099767 A2 | 8/2008 |

OTHER PUBLICATIONS

PCT Search Report for PCT Application PCT/FI2010/050246 dated Jan. 17, 2011.

\* cited by examiner

*Primary Examiner* — Binh X Tran
*Assistant Examiner* — Christopher Remavege
(74) *Attorney, Agent, or Firm* — McCormick, Paulding & Huber LLP

(57) ABSTRACT

Method of forming a protective hard mask layer on a substrate in a semiconductor etch process, comprising the step of applying by solution deposition on the substrate a solution or colloidal dispersion of an alumina polymer, said solution or dispersion being obtained by hydrolysis and condensation of monomers of at least one aluminum oxide precursor in a solvent or a solvent mixture in the presence of water and a catalyst. The invention can be used for making a hard mask in a TSV process to form a high aspect ratio via a structure on a semiconductor substrate.

2 Claims, 5 Drawing Sheets

ETCH RESISTANT ALUMINA BASED COATINGS

CROSS REFERENCE TO RELATED APPLICATIONS

This application is entitled to the benefit of and incorporates by reference essential subject matter disclosed in International Patent Application No. PCT/FI2010/050246 filed on Mar. 29, 2010.

BACKGROUND OF THE INVENTION

Field of Invention

The following disclosure relates to the manufacturing of microelectronic devices, specifically but not exclusively to layers which enable the formation structures on a substrate using photolithographic techniques. In particular, the invention relates to the methods of producing materials and coatings which can be used in photolithographic applications and their subsequent etching processes to form desired structures on a substrate, and applications thereof.

Description of Related Art

To meet the demand for smaller electronic products, there is a continuing effort to increase the performance of packaged microelectronic devices while simultaneously minimizing the area of such devices on printed circuit boards.

In continued miniaturization, reducing the height and the surface area size i.e. the density of high performance devices is difficult. A method for increasing the component density of microelectronic devices, in addition to reduced line widths, is to lay one device or integrated circuit (IC) on top of another. In practice, this is achieved by electrically coupling an active circuit layer on a die to another active circuit layer on the same, or a different, die by means of an electrically conductive through substrate vias. In semiconductor industry such are most frequently called through silicon vias (TSV).

These vertical interconnects electrically couple bond-pads or other conductive elements adjacent or nearby to one side of the dies to conductive elements adjacent or nearby to the other side of the dies. Working through the back-end-of-the-line (BEOL) or the "via last method", through silicon wafer interconnects, for example, are constructed by forming deep vias from the backside to bond-pads on the front side of the wafer, which contains most of the circuitry for the given design. The formed vias are often closed at one end, then filled with a conductive material, and after further processing the wafer in its manufacturing flow, it is eventually thinned to reduce the thickness of the final dies sufficiently to obtain a through substrate interconnect. Working though the front-end-of-the-line (FEOL) or the "via first method" the vias are formed to great extent prior to the manufacturing of designed circuitry. The "via last method" is more challenging as the vias in general are much deeper compared to those generated in the "via first method" and the formation of these include etching or laser processing through stacks of layers such as silicon and silicon oxide.

A complexity in the formation of through-substrate interconnects is in the difficulty to perform etching to give such deep, narrow holes in a substrate. These high aspect ratio vias are often formed on substrates 0.75-1.5 mm thick and should exhibit minimum amount of sidewall roughness to permit successful subsequent manufacturing steps. The closed vias can be formed by etching the holes through a pattern generated by photo lithographic techniques. The etching is predominately carried out in inductive coupled plasma (ICP) reactors where the conditions to form such vias may require considerable amount of time. Additionally, the depth of the holes is difficult to control and the etchant may damage features on substrate unless properly protected.

The vias may also be formed by laser processing holes into the substrate. Laser processing of high aspect ratio vias through the substrate is not suitable for many applications. The depths of the holes are difficult to control resulting in too shallow or deep vias. Laser processing is also a high temperature process producing hot zones which may affect neighboring structures within the wafer and requires produced residues to be removed. Hence, etching or laser processing deep, high aspect ratio holes in a substrate may be difficult in many applications.

A second complexity in the formation of the deep, high aspect ratio structures is in the pattern integrity of the structure. The patterning for a given layer is often performed by a multi-step process consisting of photo resist spin coating, photo resist exposure, photo resist development, substrate etch, and photo resist removal of a substrate. Performing etching of deep vias may require very thick photo resist during etching as the environment may cause undesirable degradation of the photo resist as well. Hence, difference in etch rates should be as large as possible between the substrate to be etched and the coating preventing the undesired etching of the substrate. Additionally, application of such thick resists may be impractical in terms of time consumed and contamination of the ICP reactor that result from the use of such thick resists. Hence the selectivity of etching of the resist used in patterning and the substrate is of great importance.

In addition, materials or hard masks, with high etch selectivity have been employed in photolithographic formation of features with a line width of 65 nm and below. As variations in line widths of the patterns during photolithographic processing can result from optical interference from light reflecting off an underlying layer on a semiconductor substrate, anti-reflective coatings (ARC) have been employed to avoid this effect. To minimize the required processing steps it is beneficial to combine the properties of the hard mask layer and the ARC in a single layer. As regards the state of the art, reference is made to US Published Patent Application No. 2008/0206578.

In view of the drawbacks with prior art in patterning and etching of materials to enable formation of deep, high aspect ratio structures and narrow line widths, there is a continued need to develop novel materials which substantially reduce degradation of the pattern forming material, improve the protection of laid out designs on a substrate and improve the manufacturing efficiency and control of deep, high aspect ratio, and other vias, holes and structures.

SUMMARY OF THE INVENTION

It is an object of the present invention to provide new compositions for applications requiring a highly etch resistant hard mask, which sufficiently maintains its thickness and properties in environments used for etching desired substrates in semiconductor manufacturing processes.

Another object of the present invention is to provide new material compositions based on aluminum oxide polymers and copolymers of aluminum and organosilicon oxides that meet the requirements for a hard mask.

A further object of the present invention is to provide a method for the preparation of a hard mask coating on a substrate.

A fourth object of the present invention is to provide a solvent system which stabilizes the aluminum oxide polymers and copolymers of aluminum and organosilicon oxides sufficiently to permit long shelf life without adverse limitations on its performance.

A further objective is to provide hard mask according to the invention that also functions as an anti-reflection coating and hard mask (etch mask) in the semiconductor or in particular in TSV process. By the anti-reflection coating according to the innovation we mean that the hard mask also functions as a bottom anti-reflection coating.

One more objective is to provide a layer in integrated circuits which possesses a coefficient of thermal expansion (CTE) value close to that of silicon.

Finally, it is an object to provide materials with so good optical properties that they will enable good lithographic processing, but also non-sacrificial nature of the film meaning that the hard mask may have a permanent optical function in the device.

These and other objects, which jointly with existing materials and methods are achieved by this present invention are claimed and described herein.

The present invention is based on the idea of forming a protective hard mask layer on a substrate in a semiconductor etch process, comprising the step of applying by solution deposition on the substrate a solution or colloidal dispersion of an alumina polymer, said solution or dispersion being obtained by hydrolysis and condensation of monomers of at least one aluminium oxide precursor in a solvent or a solvent mixture in the presence of water and a catalyst.

In particular, the preferred alumina precursors have the general formula of either

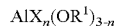

$AlX_n(OR^1)_{3-n}$ wherein
$R^1$ is independently selected from the group of hydrogen, linear alkyl, branched alkyl, cyclic alkyl, and aryls;
X is independently chosen from a group consisting of chloro, bromo, iodo, ester groups, in particular acyl, sulphate, sulfide, and nitro groups,
n is an integer which varies between 0-3,
or

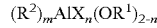

$(R^2)_m AlX_n(OR^1)_{2-n}$ wherein
$R^1$ is independently selected from the group of linear alkyl, branched alkyl, cyclic alkyl, and aryl;
$R^2$ is independently selected from group of carboxylic acids, α-hydroxy carboxylic acids, carboxylic acid salts, beta-diketones, esters and beta-ketoesters;

More specifically, the present invention is mainly characterized by what is stated in the characterizing part of claim 1.

Considerable advantages are obtained by the present invention. Thus, various embodiments of the invention are useful for making a hard mask in a TSV process to form a high aspect ratio via structure on a semiconductor substrate. Further applications include the provision of a hard mask in manufacturing of micro-electro mechanical systems and performing as an anti-reflective coating in photolithographic patterning. The present materials can also be used for providing a hard mask and antireflective coating in dual damascene interconnect fabrication.

Next the invention will be examined more closely with the aid of a detailed description with reference to the appended drawings.

BRIEF DESCRIPTION OF THE DRAWINGS

FIG. 8 shows the optical constants (index of refraction and extinction coefficient) as a function of wavelength for an $Al_xO_y$ based coating containing copolymerized with 5% phenylsilane; and.

DESCRIPTION OF PREFERRED EMBODIMENTS

Figure 1:
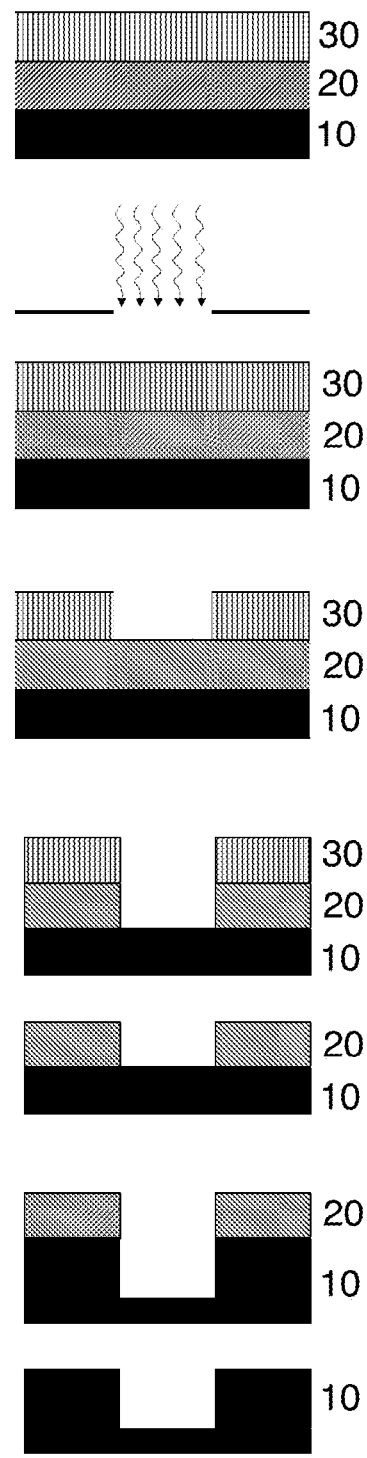
FIG. 1 shows in a simplified manner the process of applying a hard mask in lithographic applications.

Based on the above discussion, a preferred embodiment encompasses prepared solutions of novel aluminum oxide polymers, and copolymer of organosiloxanes and aluminum oxides, which can be applied in common semiconductor processes to produce a hard mask coating.

The compositions are synthesized from a number of inorganic or organoaluminum precursors. The composition may also optionally include an organosilane precursor which is copolymerized with the aluminum precursor.

The composition of the materials can be selected in such a way that it yields a material which can optionally be patterned using common photo lithographic techniques or a material that absorbs light at a desired wavelength used in photolithographic processes.

The described material is prepared by reaction of aluminum containing precursors in a solvent with added water which causes the precursors to hydrolyze and condense to yield oligomeric and polymeric species.

According to one embodiment, a plurality of different precursors (more than one) are used, which allows for greater flexibility in terms of tuning the material properties more suitable for its application.

The material obtained can be peptisized using inorganic or organic acid, beta-diketone or beta-diketone ester substances to impart improved storage stability in solution.

The backbone of the aluminum oxide polymeric material formed consists of repeating units of —Al—O—, which may be interrupted by optional organic acids, or beta-diketone derived ligands coordinated to the aluminum.

According to a preferred embodiment, a composition of the above kind can be used as a hard mask in semiconductor manufacturing. It will have a high content of aluminum (atoms).

Furthermore the material may be peptisized using organic acids, beta-diketone or beta-diketone ester substances bearing functional groups that can be activated after deposition by exposure to light permitting patterning of the hard mask material by photolithographic techniques.

Additionally, the material may be peptisized using organic acids, beta-diketone or beta-diketone ester substances bearing functionalities which absorb light at wavelengths used in photolithographic applications (193-460 nm) permitting the materials to be used in applications where anti-reflective coatings are needed. Consequently the backbone of such aluminum oxide polymeric material formed consists of repeating units of —Al—O— interrupted by functional groups derived from the peptisizing agents.

The described material may further be prepared by reaction of the above aluminum precursors in combination with an organosilicon precursor in a solvent with water causing the precursor to hydrolyze and condense to yield oligomeric and polymeric species.

The use of organosilicon precursors bearing functional groups that can be activated after deposition by exposure to light permit patterning of the hard mask material. Similarly, the use of organosilicon precursors which bear groups that absorb light at wavelengths used in photolithographic applications (193-460 nm) permit the materials to be used in applications where anti-reflective coatings are needed.

Consequently the backbone of the aluminum oxide polymeric material formed consists of repeating units of —Al—O— and —Si—O— which may be interrupted by peptisizing agents mentioned for the aluminum precursors (beta-diketone, beta-diketone ester, or organic acids and organic substituent on the silane precursor.

The obtained solution containing the recovered reaction product from the reaction of the precursors can then be applied as hard mask layers in standard lithographic manufacturing processes on semiconductor devices.

The method which the described solutions can be applied in a multitude of semiconductor applications and in particular in a lithographic process consisting of:
1. Application of the solution by means of spin-on, slit, spray, roll or other coating technique used to deposit materials in liquid phase on top of a surface of a semiconductor component or substrate.
2. Performing an optional patterning of a dried coating by exposing the coating to light of selected wavelength through a mask, and development of the non-exposed areas.
3. Allowing the applied layer to cure to obtain the hard mask in one single layer. Followed by lithographic processes in which further layers need to be constructed in a given device.

Turning now to preferred precursors, it can be noted that in one embodiment, a precursor is used (in the following "precursor 1") which has the general formula of

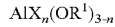

wherein
$R^1$ is independently selected from the group of hydrogen, linear alkyl, branched alkyl, cyclic alkyl, and aryls;
X is independently chosen from a group consisting of chloro, bromo, iodo, ester groups, in particular acyl, sulphate, sulfide, and nitro groups,
n is an integer which varies between 0-3.

It is further assumed that in cases where n=3, complexes such as hydrates and ether complexes are also included.

In second embodiment, another precursor (in the following "precursor 2") is used which has the general formula of

wherein
$R^1$ is independently selected from the group of linear alkyl, branched alkyl, cyclic alkyl, and aryl;
$R^2$ is independently selected from group of carboxylic acids, α-hydroxy carboxylic acids, carboxylic acid salts, beta-diketones, esters and beta-ketoesters;
X is independently chosen from a group consisting of chloro, bromo, iodo, ester groups, in particular acyl, sulphate, sulfide, and nitro groups; and
m is an integer which varies between 0 and 2 and
n is an integer which is determined by 3-m.

It is further assumed that in cases where m=0, complexes such as hydrates and ether complexes are also included.

In a third embodiment, a precursor (in the following "precursor 3") is used which has the general formula of

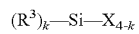

wherein
$R^3$ is independently selected from the group of linear alkyl, branched alkyl, cyclic alkyl, alkenyl (linear, cyclic and branched), alkynyl, epoxy, acrylate, alkylacrylate, heterocyclic, heteroaromatic, aromatic (consisting of 1-6 rings), alkylaromatic (consisting of 1-6 rings), cyanoalkyl, isocyanatoalkyl, aminoalkyl, thioalkyl, alkylcarbamate, alkylurea, alkoxy, acyloxy, hydroxyl, hydrogen and chloro-functionality, at least one of $R^3$ is a group in the precursor function as the functional group that can react when a latent photoactive catalyst is activated;
X is independently selected from the group of hydroxy, alkoxy, acyl, chloro, bromo, iodo, and alkylamine groups; and
n is an integer between 0 and 3.

The reaction product obtained by polymerization or copolymerization using one or more of the above precursors by means of hydrolysis will have a composition consisting of precursors 1-3 (with integer n=1) described above will constitute of a general formula consisting of following repeating units:

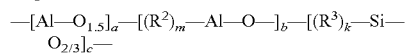

wherein
$R^2$ and $R^3$ have the same meaning as above, and
a, b, and c are numeric values which are based on the relative molar ratio of precursors 1-3 used to obtain the above composition.

The resultant hard mask coating composition has an outstanding etch performance after photo resist development. High aluminum content is preferred for that use.

In cases where an organosilane precursor is applied as a comonomer in the hydrolysis and condensation of the material a trade off exists to obtain a coating that exhibits sufficient etch selectivity and a material that can be patterning using photolithographic techniques. Thus, in practice an Al-content of 20 to 95% is preferred and an Al-content of 40 to 90% is more preferred.

To tailor the properties of the preferred composition, precursors 1 to 3 may be chosen in such way that:
one will provide sufficient etch selectivity compared to the substrate where the deep vias are formed and hence protect the areas of a substrate covered with it;
one will provide sufficient shelf life and act to control the molecular weight of the resultant composition;
one will provide sufficient adhesion to the substrate where the deep vias are formed;
one will provide functional groups that can be activated by latent catalysts which will enable patterning of the material using photolithographic techniques; and one will provide functional groups that are capable of absorbing light at wavelengths used in photolithographic applications.

More specifically, group $R^1$ may be selected from a group of organic substituents selected from $C_{1-12}$ alkyl groups in which alkoxy, cyano, amino, ester or carbonyl functionalities may be present. The alkyl groups may optionally be halogenated bearing at least one halogen atom (fluoro, chloro, bromo or iodo-group). The described alkyl groups may be linear, branched or contain cyclic species. It is preferred that the precursor containing a group described above may be purified by distillation. In particular, shorter alkyl chains containing 1-6 carbon atoms are preferred. Alkyl chains containing 1-4 carbon atoms are most preferred.

Group $R^2$ may be selected from the group of carboxylic acids, α-hydroxy carboxylic acids, carboxylic acid salts, beta-diketones, esters or beta-ketoesters selected from from $C_{1-12}$ alkyl groups in which halogen, unsaturated, and aromatic functionalities may be present. It is preferred that the precursor 2 containing a group described above may be purified by distillation or prepared in such way that the total metal ion content is lower than 500 ppb, preferably lower than 50 ppb. In particular, alkyl chains as short as possible containing 3-7 carbon atoms are preferred.

Alkyl chains containing 4-6 carbon atoms are most preferred. More preferred are embodiments containing organic acids, beta-diketones, or beta-diketo esters consisting of compounds which also contain a functionality which may be polymerized using photolithographic techniques such as acryl, alkylacryl, acrylate, alkylacrylate, and epoxy functionalities. Such functional compounds may contain 5-12 carbon atoms. Alkyl chains containing 6-10 carbon atoms are more preferred. Preferred embodiments also include organic acids, beta-diketones or beta-diketoesters containing functional groups that are capable of absorbing light of wavelengths used in photolithographic processing. Particularly preferred light absorbing embodiments are aromatic or polyaromatic (containing 2-6 aromatic rings) that have substitutents which at least one is an organic acid, a beta-diketone or a beta-diketoester.

Group $R^3$ may be selected in such way that further reactions may take place during heating permits the material to be further densified i.e. crosslinked. More preferred are those functional groups which permit the use of latent catalysts which can be activated in standard lithographic processes to yield coatings that can be patterned. Such substituents include $C_{1-12}$ alkenyl, $C_{1-12}$ alkynyl, $C_{1-12}$ acrylate, $C_{1-12}$ alkylacrylate, and $C_{1-12}$ epoxy groups. Preferred alkenyl and alkynyl groups consist of 1-6 carbon atoms such as vinyl, allyl, butenyl, pentenyl, hexenyl, butadienyl, pentadienyl, hexadienyl, acetyl, propargyl, butynyl, pentynyl and hexynyl. Acryl, alkylacryl, acrylate, alkylacrylate substituents consist preferably of 1-7 carbon atoms, which may be interrupted by a heteroatom. More preferred are those functional groups which permit the use of latent catalysts which can be activated in standard lithographic processes to yield coatings that can be patterned. Preferred acrylate substituents contain methyl- and ethyl acrylate. Preferred alkylacrylate substituents consist of methyl methacrylate, methyl ethylacrylate, ethyl methacrylate and ethyl ethacrylate. Epoxy substituents consist preferably of 1-8 carbon atoms, which may be interrupted by a heteroatom. Preferred epoxy substituents are for example glycidoxypropyl, and ethyl-(3,4-cyclohexylepoxy). The use of substituents containing the functionalities alkenyl, alkynyl, epoxy, acrylate, and alkylacrylate provides the material to be a photopatternable material when used in combination of latent catalysts that may be activated by exposure to light of desired wavelength.

Group $R^3$ may also be selected in such way that the resulting reaction product has the capability of absorbing light at wavelengths used in photolithographic processing. Such substituents include $C_{1-12}$ alkenyl, $C_{1-12}$ alkynyl, $C_{1-12}$ acrylate, $C_{1-12}$ alkylacrylate, $C_6$-$C_{36}$ aromatic and $C_6$-$C_{36}$ heteroaromatic groups. More preferred are aromatic compounds that can be purified by distillation. The preferred aromatic groups may contain substitutents such as $C_{1-6}$ alkyl, $C_{1-6}$ acyl, $C_{1-6}$ alkoxy, nitro, amino and halogen functionalities. Of particular preference are such groups which can be independently selected and employed jointly in order to adjust the optical properties, such as the index of refraction and the extinction coefficient, of the material at a desired wavelength after its cure on a semiconductor substrate.

Unambiguous examples of suitable compounds for precursor 1 include aluminum hydroxide, aluminum methoxide, aluminum ethoxide, aluminum isopropoxide, aluminum sec-butoxide, aluminum chloride (and other halogenated aluminates including their complexes and hydrates), aluminum nitrate (including its hydrates), aluminum sulfate (including its hydrates) and combinations of alkoxy and halogenated aluminum precursors such as chlorodiisopropoxyaluminum, as well as any other precursors that consist of functional groups that can be cleaved off the aluminum with ease during a hydrolysis/condensation polymerization.

Unambiguous examples of suitable precursors for precursor 2 include related aluminum precursors discussed above in which an organic group $R^2$ is included as a covalent bond or through coordination. Such compounds are 2,4-pentadione, 3-methyl-2,4-pentanedione, 3-ethyl-2,4-pentanedione, 3-propyl-2,4-pentanedione, 3,3-dimethyl-2,4-pentanedione, 3,5-heptanedione, 4-methyl-3,5-heptanedione, 4-ethyl-3,5-heptanedione, 4-propyl-3,5-heptanedione, 4,4-dimethyl-3,5-heptanedione, 6-methyl-2,4-heptanedione, 1-phenyl-1,3-butanedione, 1,1,1-trifluoro-2,4-pentanedione, 3-chloro-2,4-pentanedione, 2-acetylcyclopentanone, 2-acetylcyclohexanone, methyl acetoacetate, ethyl 2-methylacetoacetate, methyl 2-ethylacetoacetate, ethyl acetoacetate, ethylpropionylacetate, methyl 3-oxovalerate, isopropyl acetoacetate, ethyl 2,4-dioxovalerate, methyl 3-oxohexanoate, methyl 4-methyl-3-oxovalerate, allyl acetylacetoacetate, 2-methyl-3-oxo-pent-4-enoic acid methyl ester, methyl 4-methoxyacetoacetate, methyl 2-hydroxy-2-methyl-3-oxobutyrate, methyl 2-oxocyclopentanecarboxylate, methyl 2-oxocyclohexanecarboxylate, ethyl 2-oxocyclopentanecarboxylate, ethyl 2-oxocyclohexanecarboxylate, ethyl 2-ethylacetoacetate, methyl 3-oxoheptanoate, isobutyl acetoacetate, methyl 4,4-dimethyl-3-oxopentanoate, ethyl isobutyrylacetate, $C_{1-12}$ alkyl carboxylic acids, $C_{1-12}$ unsaturated carboxylic acids, and $C_{1-12}$ aromatic carboxylic acids.

Unambiguous examples of suitable precursors 3, which can be activated using latent photo active catalysts include methacryloxypropyltrimethoxysilane, methacryloxypropyltriethoxysilane, methacryloxypropyltripropoxysilane, methacryloxypropyltris(isopropoxy)silane, methacryloxypropyltrichlorosilane, methacryloxypropylmethyldimethoxysilane, methacryloxypropylmethyldiethoxysilane, acryloxypropyltrimethoxysilane, acryloxypropyltriethoxysilane, acryloxypropyltripropoxysilane, acryloxypropyltris(isopropoxy)silane, acryloxypropyltrichlorosilane, acryloxypropylmethyldimethoxysilane, acryloxypropylmethyldiethoxysilane, methylmethacryloxypropyltrimethoxysilane, methylmethacryloxypropyltriethoxysilane, methylmethacryloxypropyltripropoxysilane, methylmethacryloxypropyltris(isopropoxy)silane, methylmethacryloxypropyltrichlorosilane, methylmethacryloxypropylmethyldimethoxysilane, methylmethacryloxypropylmethyldiethoxysilane, methylacryloxypropyltrimethoxysilane, methylacryloxypropyltriethoxysilane, methylacryloxypropyltripropoxysilane, methylacryloxypropyltris(isopropoxy)silane, methylacryloxypropyltrichlorosilane, methylacryloxypropylmethyldimethoxysilane, methylacryloxypropylmethyldiethoxysilane, glycidoxypropyltrimethoxysilane, glycidoxypropyltriethoxysilane, glycidoxypropyltripropoxysilane, glycidoxypropyltris(isopropoxy)silane, glycidoxypropyltrichlorosilane, glycidoxypropylmethyldimethoxysilane, glycidoxypropylmethyldiethoxysilane, ethyl-(3,4-cyclohexylepoxy)trimethoxysilane, ethyl-(3,4-cyclohexylepoxy)triethoxysilane, ethyl-(3,4-cyclohexylepoxy)tripropoxysilane, ethyl-(3,4-cyclohexylepoxy)tris(isopropoxysilane, ethyl-(3,4-cyclohexylepoxy)trichlorosilane, ethyl-(3,4-cyclohexylepoxy)methyldimethoxysilane, and ethyl-(3,4-cyclohexylepoxy)methyldiethoxysilane.

Unambiguous examples suitable precursors 3, which can be used to tune the optical properties of the resultant material are phenyltrimethoxysilane, phenyltriethoxysilane, phenyltripropoxysilane, phenyltris(isopropoxy)silane, phenyltrichlorosilane, naphthyltrimethoxysilane, naphthyltrimethoxysilane, naphthyltripropoxysilane, naphthyltris(isopropoxy)silane, naphthyltrichlorosilane, anthracenyltrimethoxysilane, anthracenyltriethoxysilane, anthracenyltripropoxysilane, anthracenyltris(isopropoxy)silane, anthracenyltrichlorosilane, phenanthrenyltrimethoxysilane, phenanthrenyltrimethoxysilane, phenanthrenyltripropoxysilane, phenanthrenyltris(isopropoxy)silane, phenanthrenyltrichlorosilane, pyrenyltrimethoxysilane, pyrenyltrimethoxysilane, pyrenyltripropoxysilane, pyrenyltris(isopropoxy)silane, pyrenyltrichlorosilane, fluorenyltrimethoxysilane, fluorenyltrimethoxysilane, fluorenyltripropoxysilane, fluorenyltris(isopropoxy)silane, and fluorenyltrichlorosilane. These examples of aromatic substituents may be attached to the silicon from any site of the molecule (e.g. 1-naphthyl, 2-naphthyl) and may additionally bear functional groups such as alkyl, acyl, alkoxy, nitro, amino, or halogen atoms on the aromatic ring.

Polymers obtained from the above-mentioned aluminum and silane precursors which can be hydrolyzed and copolymerized with each other and contain functional groups that can be further reacted upon activation of a latent, photoactive catalyst yield coatings which can be used hard masks in photolithographic processes.

The function of above precursor groups are follows in general:
Precursor 1—provide high aluminum content for hard mask coating;
Precursor 2—impart to sufficient shelf-life and optionally a patterned profile, obtained with standard lithographic processes or provide the material a light absorbing function;
Precursor 3—impart to a patterned profile, obtained with standard lithographic processes a light absorbing function.

Preferred compositions in molar percentages of the precursors used are:
Precursor 1: 50-99;
Precursor 2: 5-80; and
Precursor 3: 1-40.

Particularly preferred molar percentages are: Precursor 1: 50-90; Precursor 2: 10-70; and Precursor 3: 5-30.

The manufacturing of the preferred embodiments occurs by performing an acid or base catalyzed hydrolysis and condensation reaction of 1-4 aluminum precursors, preferably 1-2 of aluminum precursors, optionally copolymerized with a silane precursor in a solvent or a combination of solvents. Suitable solvents to perform the hydrolysis and condensation step are acetone, tetrahydrofuran, 2-methyltetrahydrofuran, butanone, cyclopentanone, cyclohexanone, alcohols (methanol, ethanol, propanol), propylene glycol derivatives [in particular propylene glycol monomethyl ether acetate (PGMEA), propylene glycol monomethyl ether (PGME), propylene glycol monoethyl ether (PGEE), propylene glycol monopropyl ether (PNP)], ethylene glycol derivatives and methyl tert-butyl ether. Mixtures consisting of two or more of these solvents may also be employed. The weight ratio of the solvents to the precursors in the synthesis may be varied from 20:1 to 0.5:1. A weight ratio of the solvents to the precursor preferably varies in the range from 10:1 to 1:1. The amount of water used in the acid or base catalyzed hydrolysis and condensation of the precursors may vary considerably. The use of 1-3 molar equivalents of water per hydrolyzing functional group, a polymeric material is formed, while a 5-15 time excess per weight yields colloidal suspension of polycationic aluminum species. To prepare a polymeric material a 1-2 molar equivalents of water based on hydrolyzing functional groups is preferred while a 5-10 excess by weight is preferred when colloidal polycationic aluminum species are prepared. The reaction mixture may be stirred at room temperature or brought to reflux for 1-48 hours, preferably 1-24 hours during synthesis.

Once the hydrolysis and condensation step is complete, excess reagents (water), reaction byproducts (such as methanol, ethanol, isopropanol, 2-butanol) and the solvent may be removed under reduced pressure. During the removal of volatiles another solvent, possessing a higher boiling point and more desirable properties in terms of its use in further manufacturing steps of the polymer solution may be introduced. Once removal of volatiles is complete, the obtained material may then be formulated to its final composition or be subjected to a molecular weight adjustment step. This molecular weight increase step is carried out at elevated temperatures ranging from 50° C. to 180° C. The use of 60-120° C. during the molecular weight adjustment step is more preferred. After the molecular weight increase step, the material may be formulated to its final composition.

The formulation consists of diluting the material using a solvent or combinations of these. Solvents used in final formulation are chosen to maximize the uniformity of the coating and storage stability. For good spin coating properties, solvents of higher boiling points and viscosities may be preferred (e.g. PGMEA). Stabilizing solvents may be added to the product to improve storage stability. Such solvents possess most frequently contain hydroxyl groups as these either coordinate to the polymeric OH's or react with these appreciably without affecting adversely on the properties of the cured film. Additives, such as surfactants (by e.g. BYK-Chemie, 3M and Air Products), photo- or thermally latent catalysts (e.g. Rhodorsil 2074 and Irgacure 819), and further peptisizing agents may be added. The surfactant may improve wetting of the substrate which is to be coated and hence improves the uniformity of the resultant film. Generally, non-ionic surfactants are preferred. The peptisizing agent provides improved shelf life to the product. The peptisizing agent may consist of inorganic or organic acids, or beta diketone derivatives.

After coating, drying and curing, a film consisting of an alumina or aluminosiloxane core with carbon based functionalities is formed. The cure temperature is preferred to be at most 400° C., but more preferred to be 250° C. A single cure step is preferred. The resultant cured film thickness is dependent on the dilution of the polymer solution and ranges usually between 10-1000 nm. The refractive index of the film is between 1.4-1.7 when measured using a tool at a wavelength of 632 nm. The film is preferred to possess a thermal stability up to 400° C. and a minimal out gassing of volatile components to reduce adverse effects upon subsequent coatings or processes used in semiconductor fabrication.

FIG. 1 shows for a lithographic process: deposition of hard mask on substrate to be patterned, deposition of photoresist, exposure of photoresist, developing the photoresist, etching the hard mask removal of photoresist, etching pattern to desired material and removal of the hard mask. According to the embodiment shown in that figure, the described materials are applied to a substrate 10 by means of spin coating. Other coating methods may also be applicable if the application in which the described materials are used in requires this. After coating, the described material is then cured to give hard mask 20. A photo resist 30 is then applied on top of the hard mask and processed (exposed and developed) to yield a pattern where the hard mask is exposed. The pattern is then transferred to the hard mask by dry or wet etching. Prior to the etching of the substrate through the opened patterns generated on the hard mask, the photo resist may be removed following common practices which are well known to those familiar with the art. Finally, after the etching of deep, high aspect ratio vias on the substrate, the hard mask is removed using dry or wet cleaning procedures. However, a hard mask material which is patterned simultaneously during photo resist development may be preferred if the pattern is transferred in a sufficient manner by this techniques. This occurs when the hard mask layer develops jointly with the photo resist and may result in considerable saving in time and cost when a separate pattern transfer step by wet or dry etching is not needed for the hard mask.

Figure 2:
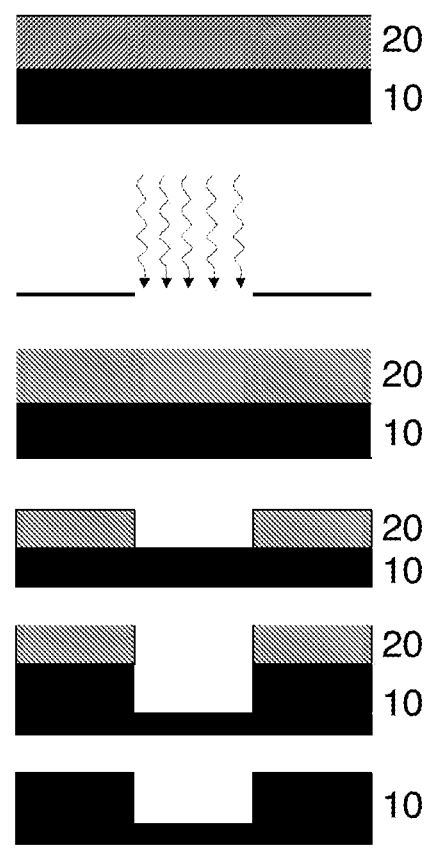
FIG. 2 shows a similar depiction of the application of photo imageable alumina based hard mask material in lithographic applications.

FIG. 2 shows a substrate 10, and photo imageable hard mask 20. Includes deposition of hard mask on substrate to be patterned, exposure of patternable hard mask, developing the soluble part of the exposed hard mask, etching pattern to desired material and removal of hard mask.

Examples 1 to 3 describe materials prepared and cured in this way. These were subjected to common DRIE etching conditions (Table 1). Their etch selectivities to Si are shown in Table 2.

Figure 3:
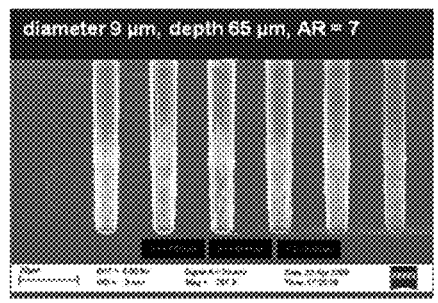
FIG. 3 shows in sideview a deep via formed on silicon using polymer from Example 1 as a hard mask in Bosch type DRIE etching.
Figure 4:
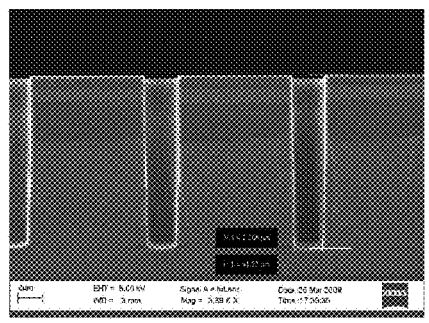
FIG. 4 shows in sideview a deep via formed on silicon using polymer from Example 1 as a hard mask in cryogenic DRIE etching (AR=7)
Figure 5:
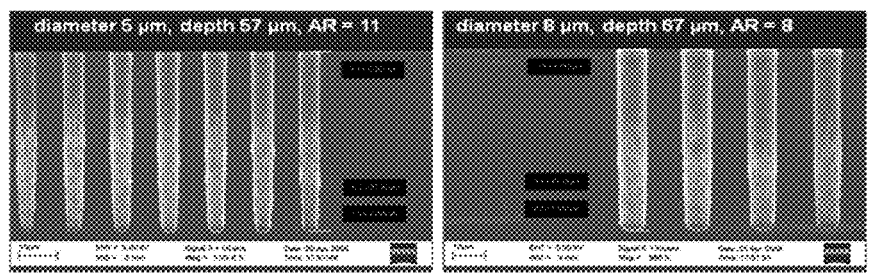
FIG. 5 shows a deep via formed on silicon using polymer from Example 3.
Figure 6:
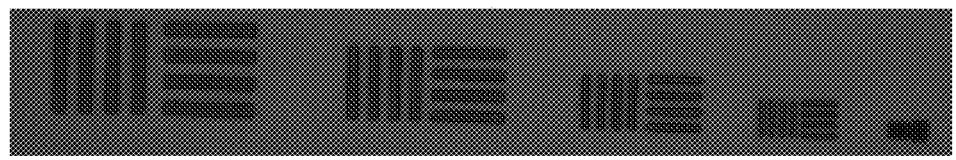
FIG. 6 shows the patterns obtained by photolithographic processing of material prepared in Example 5; resolution of patterns: 5 µm, 4 µm, 3 µm, 2 µm, and 1 µm.

Standard pattern formation of the alumina coatings were obtained using a common pattern transfer employing a photoresist. Deep vias were formed using the same DRIE conditions without degradation on the Si protected by the alumina hard mask (FIGS. 3-5).

A more preferred method to yield patterns on the hard mask, is to prepare a hard mask which itself can be patterned by photolithographic techniques. In such event, considerable savings in manufacturing time and cost can be achieved. The patterned hard mask can be obtained through techniques for negative tone photo resist (FIG. 2) which includes the coating of a substrate (10), drying, exposure of the hard mask (20) through a mask, post exposure bake, development of non-exposed areas and final cure. After etching, the hard mask is removed using dry or wet cleaning procedures. Similarly, the patterned hard mask may also be obtained through techniques for positive tone photo resists. The use of a latent radiation sensitive catalyst provides such a possibility to crosslink the alumina based hard mask. Such latent catalysts decompose upon exposure to radiation to give an acid or radical which cause the functional groups to undergo reactions. The cure of the exposed parts may occur due to condensation reactions catalyzed by the strong acid liberated by exposure. The cure may also be achieved by other means, providing that functional groups which can undergo acid or radical initiated polymerization reactions are present in the composition of the polymer. As described earlier, the use of precursors 2 or 3 containing reactive $R^2$ or $R^3$ substituents such as alkenyl, alkynyl, epoxy, acrylate, and alkylacrylate may provide the material to be cured through the latter mechanism when used in combination with catalysts that can be activated by exposure to light of desired wavelength. In a negative tone process, the regions through which light passes to the film will be cured when irradiation is carried out through a patterned mask. The non-exposed areas can then be dissolved in the aqueous developer resulting in a transfer of the pattern on the mask to the film. Prior to the exposure of the film to radiation a heating step is carried out to remove the volatile components of the formulation. This temperature is between 50-170° C., preferably between 70-150° C. not to cause premature cross-linking of the resin which may result in the non-exposed areas to be insoluble to developers. Similarly, after the exposure a post exposure bake is carried out to accelerate the reactions initiated by the latent catalyst. For a positive tone process, the image is in practice reversed when compared to the negative tone process. Hence, the exposed regions of a positive tone material dissolve in the developer.

Patternable materials may also be obtained when a precursor 2 bears a reactive functionality that may be polymerized initiated by a radiation sensitive latent catalyst. For those known to the art, this and the above provides a possibility to form patterned structures when the light is directed through a mask and a stepper.

The amount of precursors 2 or 3 containing reactive $R^2$ or $R^3$ substituents is important in order to achieve patternable materials. It has been found that 10% of a reactive precursor 3 was insufficient to give a patternable material (Example 4). Similarly it was found that an excess or lack of sufficient amount of precursor 2 resulted in no or less favorable pattern formation (Example 9).

In the process flow of forming deep high aspect ratio vias, the removal of the alumina hard mask can also be omitted. Hence, the alumina based materials are expected to possess CTE values close to that of silicon. Such similarity in CTE values are important in non-sacrificial applications of the material to minimize mechanical stress created or thermal mismatches experienced in a device during and after various manufacturing steps which involve elevated temperatures.

Figure 7:
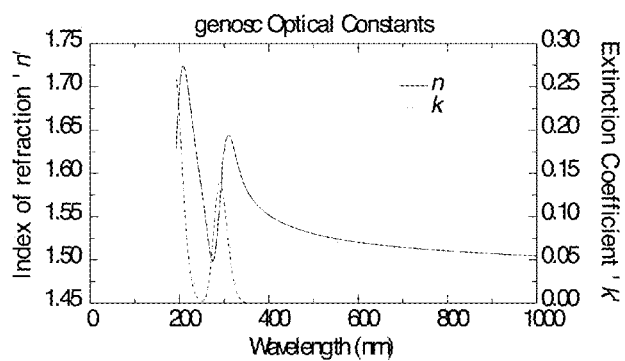
FIG. 7 shows the optical constants (index of refraction and extinction coefficient) as a function of wavelength for an $Al_xO_y$ based coating containing copolymerized with 10% phenylsilane.
Figure 8:
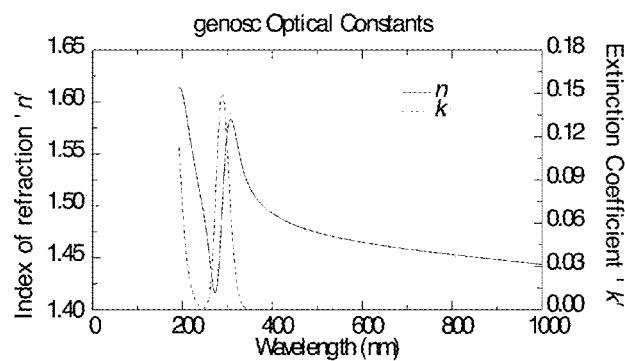
Figure 9:
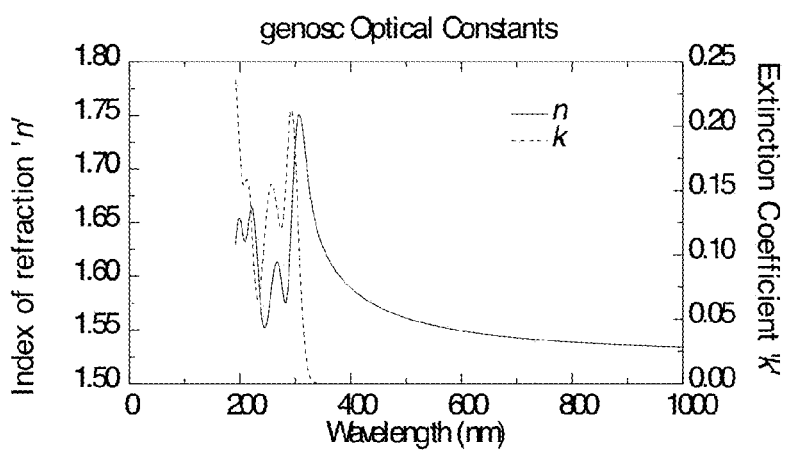
FIG. 9 shows the optical constants (index of refraction and extinction coefficient) as a function of wavelength for an $Al_xO_y$ based coating containing copolymerized with 5% phenylsilane and 5% phenanthrenylsilane.

Alumina based hard mask coatings containing groups which are capable of absorbing light may be used in advanced lithographic applications where narrow line widths are formed. The light absorbing groups may be introduced as substituents of silicon ($R^3$ in precursor 3) or as a coordinating ligand to aluminum ($R^2$ in precursor 2). In such lithographic applications, the ability to control the optical properties such as index of refraction and the extinction coefficient of the film are of great importance. Examples 6-8 describe the synthesis of materials where the optical constants can be adjusted by controlling the substituent and its content in the alumina based hard mask. The values for the optical constants for various wavelengths used in lithographic applications are shown in FIGS. 7-9. For those known to the art, the index of refraction and the extinction coefficient can be adjusted by choosing the light absorbing compounds and their content in the given hard mask composition. Hence, the light absorbing moieties are not limited to the groups given in the examples and other moieties known to absorb in a desired wavelength can be used to tune the optical constants suitable for the particular application.

Based on the above, in one embodiment, the present method comprises steps in which the hard mask is patterned using lithography and etch. This embodiment comprises in combination the steps of depositing a hard mask material by means of spin, slit, spray or other method suitable for application of materials in solution; curing of the hard mask material at desired temperatures;

depositing, patterning and developing a photoresist on said hard mask to expose desired regions of the hard mask;

transferring the pattern from mentioned photoresist to specified exposed regions of the given hard mask by means of selective etching;

optionally removing the said, patterned photoresist using conventional etching techniques; and transferring the pattern from the mentioned hard mask and photoresist to the given substrate using etching processes.

In the last step, preferably etching processes are used which are highly selective and which do not cause damage on the non-exposed areas of the substrates due to undesired reactions through the hard mask layer.

In one embodiment, the hard mask composition contains at least —Al—O— and —Si—O— resin core interrupted by organic substituents. In another embodiment, the hard mask composition contains at least —Al—O— resin core interrupted by organic substituents.

The structures produced can, in one embodiment, exhibit etch selectivity between the hard mask and a substrate is at least 500:1. However, it can vary in a much broader range also, of about 10,000:1.

In one embodiment, the curing of the coating is carried out on a hotplate at a temperature of 200-400° C., preferably at 200-300° C. In another embodiment, the curing of the coating is carried out in a furnace at a temperature of 400-1000° C., preferably at 400-650° C.

In any of the above embodiments, a developer comprising or consisting of a diluted TMAH solution can be used.

The present process according to the present invention can be used in embodiments wherein via structures having high aspect ratios are aimed at. Thus in one embodiment, the process yields high aspect ratio via structure on a semiconductor substrate with aspect ratio at least 5:1 or more preferably higher 50:1. In another embodiment, the process yields high aspect ratio via structure on a semiconductor substrate with via depth of 100 μm, preferably more than 200 μm.

As apparent, the invention can be used in various methods of performing semiconductor lithography, etch and via formation process using a protective alumina based hard mask layer that is capable of absorbing light used in lithographic processing.

In another embodiment, the present invention comprises a method of forming a thin film hard mask on a substrate comprising the steps of:

reacting the substrate surface with a chemical composition obtained by hydrolyzing a first metal oxide precursor with a hydrolyzing catalyst in the presence of a peptisizer and a solvent, optionally further co-reacting the first metal oxide precursor with a second metal or metalloid oxide precursor, to produce a solution of an intermediate oligomeric or polymeric material;

optionally performing a solvent exchange process for the intermediate chemical solution;

heating the thin film hard mask at elevated temperature to undergo solvent removal partial or complete cross linking reaction; and processing the thin film hard mask by a semiconductor lithographic method.

In the method, as apparent from the above, the first metal oxide precursor can be selected from the group of aluminum chloride, aluminum alkoxide, aluminum nitrate, aluminum acetate, aluminum acetoacetate precursor and combinations thereof.

In one embodiment, the intermediate oligomeric or polymeric thin film hard mask can be cured at the elevated temperature can lithographically patterned by using negative to lithography process.

In any of the above embodiments, the $R^3$ group is preferably a mixture of phenyl and a polyaromatic compound. By this embodiment to obtain predetermined optical properties by lithographic pattering.

More particularly, examples of applications in which the materials work as hard masks include:

A. Hard mask compatible with redistribution, wafer bumping dielectrics or passivation layers. In particular the hard mask can be coated on a dielectric (organic, hybrid or inorganic) material, normally patterned in a lithographic process and afterwards removed with mild chemical stripping chemical without removing or damaging the dielectric film. The stripping selectivity can be adjusted with organic additives such as acac during the polymerization.

B. Hard mask containing an organic group having absorption at lithographic process wavelengths (typically 193 nm-460 nm). This light attenuation component provides the material to be simultaneously used in an anti-reflection coating function when it used in conjugation with photo resist lithographic patterning.

C. Hard mask compatible with second transfer layer material such as spin-on-carbon (SOC) polymer. The hard mask can be coated on SOC polymer to enhance total stack selectivity. After via patterning the stack can be removed with mild wet chemical removal.

D. Hard mask and etch stopper in dual damascene interconnect fabrication. In dual damascene process, SiCxNy, or SiOxNy are used as etch stopper that separate Cu levels. By replacing conventional etch stopper with described materials, via height can be reduced thus reducing the total Cu line length.

E. Hard mask for micro-electro-mechanical systems (MEMS) manufacturing. The described materials can be patterned into desired shapes using photolithographic techniques. The vertical dimension is adjusted by etching of the substrate.

Potential applications of the materials may also include other than in the formation of deep, high aspect ratio structures. Such specific examples include:

A. Passivation applications where high mechanical properties are required.

B. For shallow trench isolation for both logic and memory devices. The described materials may also be used as a filling material for the shallow isolated trenches.

TABLE 1

Parameters used during the 10 min etch tests carried out for reported values.

| Cycle Time | | Gas | | Power | | | | Temp. |
|---|---|---|---|---|---|---|---|---|
| | | Etch | Passivation | Etch | Etch | Passivation | Passivation | |
| Etch (sec.) | Passivation (sec.) | SF6/O2 (sccm) | C4F8 (sccm) | Coil (W) | Platen (W) | Coil (W) | Platen (W) | Platen (C.) |
| 12 | 7 | 130/13 | 110 | 900 | 14 | 800 | 0 | 24 |

The following non-limiting examples illustrate the invention.

Example 1

Aluminum isopropoxide (15 g) and THF (52.5 g) were placed in a round bottom flask equipped with a magnetic stir bar and a reflux condenser. Acetoacetonate (acac, 7.35 g) was added dropwise once the aluminum isopropoxide had dissolved. The mixture was stirred at room temperature for 1 h and then methanol (52.5 g) was slowly added, followed by a mixture of 0.01M $HNO_3$ (5.29 g) and isopropanol (5.29 g). After completion of the additions, the reaction mixture was allowed to reflux for 16 h by placing the flask in an oil bath at 100° C. When the reaction mixture had cooled to room temperature, volatiles were removed under reduced pressure until 35.4 g of the mixture remained. 2-Butanone (95 g) was added and the evaporation step was repeated until 33.7 g material remained. The obtained solution was then formulated with 2-butanone and methanol to produce a solution that was spin coated on a substrate. A coating having an index of refraction of 1.50 and a thickness of 81 nm was obtained after a 200° C. cure.

Example 2

The above was repeated using acac (3.68 g). The obtained solution was formulated with 2-butanone and methanol to produce a solution that was spin coated on a substrate. A coating having an index of refraction of 1.44 and a thickness of 108 nm was obtained after a 200° C. cure.

Example 3

Aluminum isopropoxide (3 g) and ethanol (11.25 g) were placed in a three-necked round bottom flask equipped with an overhead stirrer and a reflux condenser. The flask was immersed in an oil bath at 100° C. After 5 min, a mixture of deionized water (22.5 g) and 60% $HNO_3$ (0.14 g) was slowly added and allowed to reflux for 24 h. The reaction mixture was further formulated using deionized water and ethanol. The solution was spin coated on a substrate and cured at 200° C. to yield a coating having an index of refraction of 1.50 and a thickness of 93 nm.

Example 4

The preparation of Example 2 was repeated. After removal of volatiles, 42.5 g of material having a solid content of 18.1% was obtained. In a separate reaction, glycidoxypropyl-trimethoxysilane (5 g), acetone (10 g) and 0.01M $HNO_3$ (1.14 g) was allowed to stir at room temperature for 24 h to give a glycidoxypropylsilane based hydrolysate. The aluminum containing solution (3 g) was mixed with 0.44 g of the glycidoxypropylsilane based hydrolysate to give a copolymer with molar ratio of Al:Si equal to 9:1. The homogenous mixture was heated at 60° C. for 30 min. The material was formulated with photo acid catalysts, coated and exposed through a mask. After development, no patterns were obtained.

Example 5

The procedure of Example 4 was repeated. The molar ratio of Al:Si was set to 7.5:2.5. The aluminum containing solution (16.6 g) was mixed with 7.3 g of the glycidoxypropylsilane based hydrolysate. The homogenous mixture was heated at 75° C. for 45 min and the obtained solution was formulated with cyclohexanone and photo acid generators. The solution was spin coated on a substrate and cured at 200° C. to yield a coating having an index of refraction of 1.51 and a thickness of 152 nm. The material could be patterned using photolithographic techniques (FIG. 5).

Table 2 shows the properties and etch rate results of the materials prepared by the examples below in comparison with a standard photo resist. Etch rate 1 based on Bosch type and etch rate 2 based on cryogenic DRIE processes.

TABLE 2

| Material | Cure temperature [° C.] | RI | Etch rate 1 [nm/min] | Etch rate 2 [nm/min] |
|---|---|---|---|---|
| Shipley SPR700 | | | 31.1 | |
| Example 1 | 400 | 1.553 | 0.4 | 0.2 |
| Example 2 | 400 | 1.489 | 0.9 | |
| Example 3 | 400 | 1.502 | 0 | |
| Example 5 | 200 | 1.510 | 2.5 | |
| Example 5 | 400 | 1.510 | 1.1 | |

Example 6

The preparation of Example 2 was repeated. After removal of volatiles, 263.97 g of aluminum oxide containing material having a solid content of 19.76% was obtained. In a separate reaction, acetone (49.76 g) and phenyltrimethoxysilane (51.76 g) were place in a round bottom flask equipped with a Teflon covered magnetic stir bar and a reflux condenser. Nitric acid (0.01M, 14.10 g) was drop wise added to the flask and the reaction mixture was then allowed to stir at room temperature for at least one hour. Of the aluminum oxide solution, 10.0 g was placed into a 50 ml round bottomed flask equipped with a Teflon covered magnetic stir bar and a reflux condenser. A 10 mol-% phenylsiloxy containing aluminum oxide mixture was obtained by drop wise addition of 0.92 g of the phenylsiloxy hydrolysate. The mixture was stirred at room temperature for 5 min and then placed in an oil bath at 75° C. for 10 min. A highly viscous, gel like material was obtained and stored at room temperature overnight. Then n-propoxy propanol (PNP, 15 g) was added and 6 drops of concentrated nitric acid was added while the mixture was vigorously stirred. The material was then filtered and spin coated at 2000 rpm and cured at 200° C. for 5 min to obtain a film having an index of refraction of 1.5171 and a thickness of 134 nm

Example 7

The preparation of Example 6 was repeated. A 5 mol-% phenylsiloxy containing aluminum oxide mixture was obtained by drop wise addition of 0.43 g of the phenylsiloxy hydrolysate. The mixture was stirred at room temperature for 5 min and then placed in an oil bath at 75° C. for 30 min. A highly viscous, gel like material was obtained and stored at room temperature overnight. Then cyclohexanone was added, the material was filtered and spin coated at 2000 rpm and cured at 200° C. for 5 min to obtain a film having an index of refraction of 1.4555 and a thickness of 427 nm

Example 8

The preparation of Example 6 was repeated. A 5 mol-% phenylsiloxy and 5 mol-% phenanthrenylsiloxy containing aluminum oxide mixture was obtained by drop wise addition of 0.20 g of the phenylsiloxy hydrolysate and 0.79 g of a phenanthrenylsiloxy hydrolysate prepared in a similar manner as the phenylsiloxy hydrolysate. The two hydrolysates were simultaneously added drop wise to the aluminum oxide containing solution. The mixture was stirred at room temperature for 5 min and then placed in an oil bath at 75° C. for 20 min. A highly viscous, translucent, gel like material was obtained and stored at room temperature overnight. Then n-propoxy propanol (PNP, 15 g) was added and 6 drops of concentrated nitric acid was added while the mixture was vigorously stirred. The material was then filtered and spin coated at 2000 rpm and cured at 200° C. for 5 min to obtain a film having an index of refraction of 1.5456 and a thickness of 194 nm.

TABLE 3

Values of optical constants for alumina based hard masks in Examples 6-8

| Example # | 193 nm wavelength | | 248 nm wavelength | |
| --- | --- | --- | --- | --- |
| | N | k | n | k |
| 6 | 1.629 | 0.26 | 1.589 | 0.003 |
| 7 | 1.613 | 0.11 | 1.491 | 0.001 |
| 8 | 1.629 | 0.24 | 1.555 | 0.132 |

Example 9

Aluminum isopropoxide (5 g) and IPA (15 g) were placed in a round bottom flask equipped with a magnetic stir bar and blanketed with argon. Ethyl benzoyl acetate (1.95 g) was added drop-wise once the aluminum isopropoxide had dissolved. The mixture was stirred at room temperature for 5 minutes before the addition of hydrochloric acid (10M, 0.01 g) and water (0.38 g). After completion of the additions, the reaction mixture was allowed to stir at room temperature for 16 h. The solution having a solid content of 31% was then formulated with Irgacure 819 (5 wt %) and filtered (0.1 µm) before spin-coating. The coated material could be patterned by photolithographic techniques to yield a positive tone image.

Although various embodiments of the present invention have been described and shown, the invention is not restricted thereto, but may also be embodied in other ways within the scope of the subject-matter defined in the following claims.

What is claimed is:

1. A method of forming a protective hard mask layer on a substrate in a semiconductor etch process, comprising the step of applying by solution deposition on the substrate a solution or colloidal dispersion of a polymer, said solution or dispersion being obtained by the steps consisting of hydrolysis and condensation of monomers of aluminum isopropoxide in a solvent or a solvent mixture in the presence of water and a catalyst to form an alumina polymer, followed by combining the alumina polymer with a silane polymer formed by hydrolysis and condensation of glycidoxypropylsilane, wherein the molar ratio of Al:Si is 7.5:2.5.

2. The method according to claim 1 wherein the cure temperature is 400° C.

* * * * *